(12) United States Patent
Wang

(10) Patent No.: US 6,242,300 B1
(45) Date of Patent: Jun. 5, 2001

(54) MIXED MODE PROCESS FOR EMBEDDED DRAM DEVICES

(75) Inventor: Chen-Jong Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/431,534

(22) Filed: Oct. 29, 1999

(51) Int. Cl.⁷ .............................................. H01L 21/8242
(52) U.S. Cl. ............................................................. 438/241
(58) Field of Search ................................... 438/239–256, 438/396

(56) References Cited

U.S. PATENT DOCUMENTS

| | | | |
|---|---|---|---|
| 5,605,853 | 2/1997 | Yoo et al. | 437/43 |
| 5,702,988 | 12/1997 | Liang | 438/238 |
| 5,719,079 | 2/1998 | Yoo et al. | 438/238 |
| 5,866,451 | * 2/1999 | Yoo et al. | 438/241 |
| 6,004,841 | * 12/1999 | Chang et al. | 438/238 |
| 6,030,872 | * 2/2000 | Lu et al. | 438/283 |
| 6,103,622 | * 8/2000 | Huang | 438/652 |
| 6,117,725 | * 9/2000 | Huang | 438/241 |

* cited by examiner

*Primary Examiner*—Richard Booth
(74) *Attorney, Agent, or Firm*—George O. Saile; Stephen B. Ackerman; William J. Stoffel

(57) ABSTRACT

A method for forming an embedded DRAM device with a mixed mode capacitor in the logic. The process begins by providing a semiconductor structure having a logic area and a memory area. The logic area and the memory area are separated by an isolation structure, and the logic area has a second isolation structure thereon. A first dielectric layer is formed over the semiconductor structure, and a first polysilicon layer is formed on the first dielectric layer. The first polysilicon layer and the gate dielectric layer are patterned to form an opening over the memory area. In a key step, an implant mask is formed over the first polysilicon layer with an opening over the second isolation structure, and impurity ions are implanted into the first polysilicon layer through the opening in the implant mask. After the implant mask is removed, a second dielectric layer is formed over the semiconductor structure and the first polysilicon layer. A second polysilicon layer is formed on the second dielectric layer; a silicide layer is formed on the second polysilicon layer; and a hard mask layer is formed on the silicide layer. The second polysilicon layer, the silicide layer, and the hard mask layer are patterned to form a bottom electrode for a mixed mode capacitor over the second isolation structure in the logic area and gates in the memory area. The first polysilicon layer is patterned to form gate structures in the logic area.

13 Claims, 3 Drawing Sheets

MIXED MODE PROCESS FOR EMBEDDED DRAM DEVICES

BACKGROUND OF INVENTION

1) Field of the Invention

This invention relates generally to fabrication of a semiconductor device and more particularly to a method for forming an embedded DRAM device with a mixed mode capacitor.

2) Description of the Prior Art

Two of the major classifications of devices manufactured by the semiconductor industry are logic and memory. Logic devices are used primarily to process information, while memory devices are used for information storage. Traditionally, while these two device types are found in virtually all electronic systems, such as computers and the like, they have been manufactured on separate integrated circuits and connected only at the card or board level. This has been due to differences in manufacturing processes, cost considerations, economies of scale, and other difficulties in fabricating different device structures on the same substrate.

However, trends in the semiconductor industry are driving toward making it both desirable and feasible to blend memories and logic on the same integrated circuit (IC). The process for combining logic and memory on the same IC is called an embedded process. Cost and performance are the two key factors contributing to these trends. While significant economies of scale can be realized by separate batch processing of large numbers of semiconductor wafers for the two types of device, due to the different process steps needed to produce them, cost savings can also be realized by forming logic and memory on the same IC. For example, an embedded process IC requires decreased area as compared to separate ICs because of the elimination of input/output pins, wiring, etc, thereby, increasing yield and reducing cost.

Performance enhancements may also make blending logic and memory on the same IC attractive for particular applications. In electronic systems in which logic and memory are packaged separately, data signals between the two may have to pass through several layers of packaging (i.e. through the original IC chip to external pins, then through the card and/or board wiring, and finally into the receiving IC chip including its internal wiring) all of which cause undesirable propagation delays. As device densities have increased and device sizes have decreased, transistor switching speeds no longer limit the logic delay or access time of the IC, Rather, the time for the device to charge capacitive loads is the limiting factor for IC performance. The capacitive load is partially dependent on the length of lines interconnecting devices, and so minimizing these connection lengths, as through combining logic and memory on the same IC, will enhance performance.

It is also desirable to integrate mixed-mode capacitors with the logic and memory on the same IC. Capacitors are a basic building block for many electronic circuits, and may be used for analog applications such as switched capacitor filters, or for digital applications such as the storage node for a dynamic random access memory (DRAM). Traditionally, formation of a capacitor requires separate photo masks for the bottom electrode and the top electrode. Photo masks are a significant cost driver in IC fabrication.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,866,451 (Yoo et al.) shows a method for forming a 4T SRAM and mixed mode capacitor in logic.

U.S. Pat. No. 5,719,079 (Yoo et al. al.) shows a method for forming a 4T SRAM and mixed mode capacitor in logic with a salicide process.

U.S. Pat. No. 5,702,988 (Liang) shows a process for forming an embedded device.

U.S. Pat. No. 5,605,853 (Yoo et al.) shows a method for forming a 4T SRAM and floating gate memory cells.

SUMMARY OF THE INVENTION

It is an object of the present invention to provide a method for forming a mixed mode capacitor in an embedded DRAM process.

It is another object of the present invention to provide a method for forming a mixed mode capacitor in an embedded DRAM process with a minimum quantity of photo masks.

It is yet another object of the present invention to provide an embedded DRAM process which forms a mixed mode capacitor, provides polycide and hard mask for the memory gates, and provides titanium silicide source and drain contacts, and contacts for the logic gates.

To accomplish the above objectives, the present invention provides a method for forming an embedded DRAM device with a mixed mode capacitor in the logic. The process begins by providing a semiconductor structure having a logic area and a memory area. The logic area and the memory area are separated by an isolation structure, and the logic area has a second isolation structure thereon. A first dielectric layer is formed over the semiconductor structure, and a first polysilicon layer is formed on the first dielectric layer. The first polysilicon layer and the gate dielectric layer are patterned to form an opening over the memory area. In a key step, an implant mask is formed over the first polysilicon layer with an opening over the second isolation structure, and impurity ions are implanted into the first polysilicon layer through the opening in the implant mask. After the implant mask is removed, a second dielectric layer is formed over the semiconductor structure and the first polysilicon layer. A second polysilicon layer is formed on the second dielectric layer; a silicide layer is formed on the second polysilicon layer; and a hard mask layer is formed on the silicide layer. The second polysilicon layer, the silicide layer, and the hard mask layer are patterned to form a bottom electrode for a mixed mode capacitor over the second isolation structure in the logic area and gates in the memory area. The first polysilicon layer is patterned to form gate structures in the logic area.

The present invention provides considerable improvement over the prior art. The present invention provides a method for forming an embedded DRAM device with a mixed-mode capacitor requiring only one additional photo mask compared to the inventors' current embedded DRAM process. Also, the present invention provides a method for forming an embedded DRAM device having polycide and a hard mask for the DRAM gates and titanium silicide source and drain contacts for the logic gates.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming an embedded DRAM device with a mixed mode capacitor in the logic. The present invention allows a mixed mode capacitor to be implemented into the inventor's current embedded DRAM process with only one extra photo mask.

Figure 1:
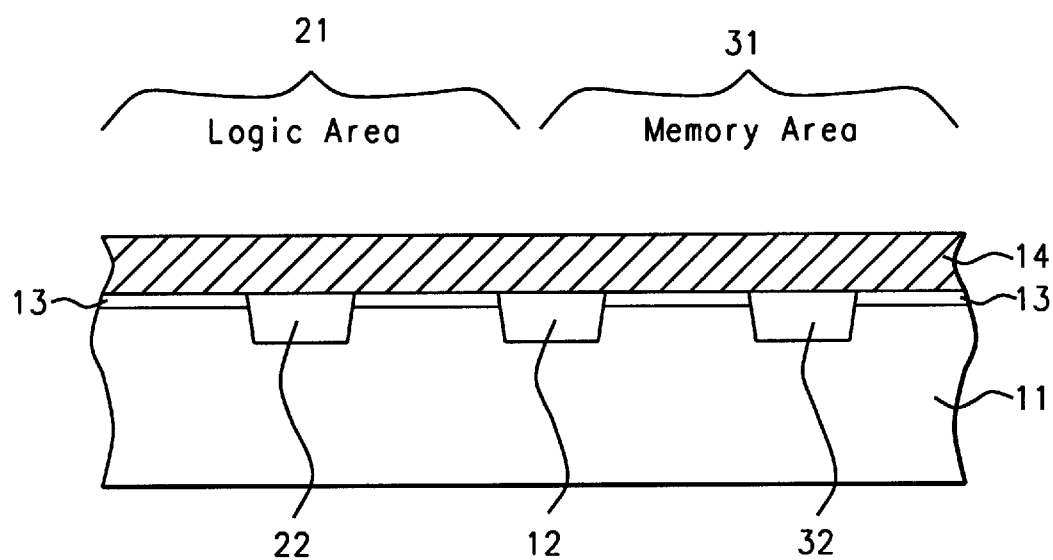
FIGS. 1 through 6 illustrate sequential sectional views of a process for forming a mixed mode capacitor in an embedded DRAM process, according to the present invention.

Referring to FIG. 1, the process begins by providing a semiconductor structure (11) having a logic area (21) and a memory area (31) thereon. Semiconductor structure should be understood to possibly include a wafer or substrate comprised of silicon or other semiconducting material or other substrate structures known in the art, such as a silicon-on-insulator (SOI) structure. Semiconductor structure should be understood to possibly farther include conductive and/or insulating layers formed over such substrate or wafer, and active and/or passive devices formed over or in such substrate or wafer.

An isolation structure (12), such as a shallow trench isolation (STI) or field oxide (FOX) is formed on the semiconductor structure (11) defining and separating the logic area (21) and the memory area (31). The logic area (21) is subdivided by one or more isolation structures (22). The memory area (31) can also be subdivided by one or more isolation structures (32).

Still referring to FIG. 1, a first dielectric layer (13) is formed over the semiconductor structure (11), and a first polysilicon layer (14) is formed on the first dielectric layer (13). The first dielectric layer (13) is preferably comprised of silicon dioxide formed by thermal oxidation to a thickness of between about 30 Angstroms and 60 Angstroms. The first polysilicon layer (14) is deposited, undoped, to a thickness of between about 1800 Angstroms and 2200 Angstroms. The first polysilicon layer is preferably deposited using a plasma enhanced chemical vapor deposition.

Figure 2:
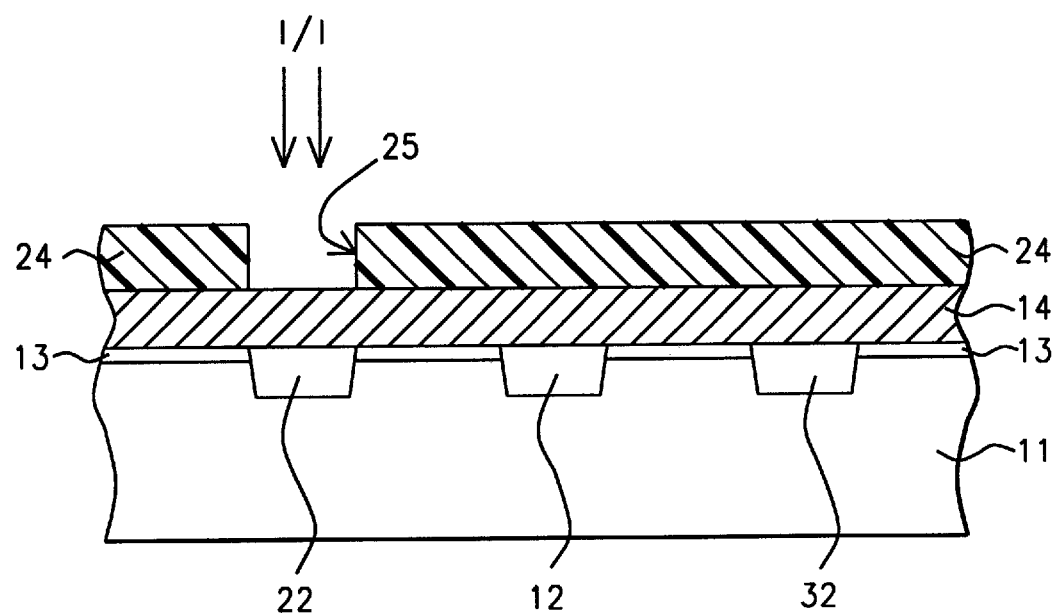

Referring to FIG. 2, an implant mask (24) is formed over the first polysilicon layer (14). The implant mask (24) has an opening (25) over the second isolation structure, and is preferably comprised of photoresist. Impurity ions are implanted in the first polysilicon layer (14) through the opening (25) in the implant mask (24). The ions can be phosphorous or arsenic, most preferably phosphorous, implanted at a dose of between about 1 E14 atm/cm$^2$ and 1 E16 atm/cm$^2$, and at an energy of between about 20 KeV and 100 KeV. Following ion implantation, the implant mask is removed. For a photoresist implant mask, this can be done by ashing in $O_2$ as is known in the art.

Figure 3:
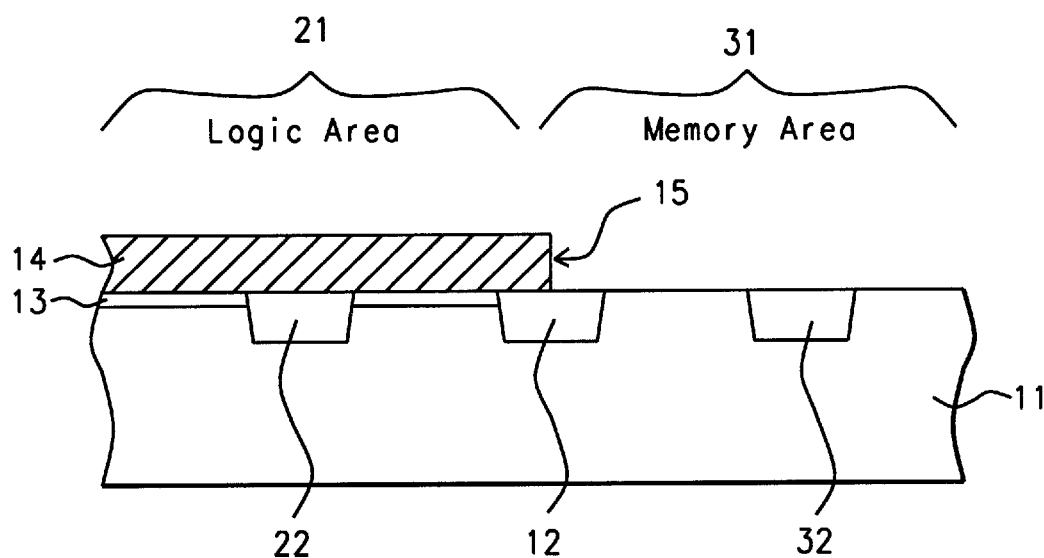

Referring to FIG. 3, the first polysilicon layer (14) and the gate dielectric layer (13) are patterned to form an opening (15) over the memory area (31). The first polysilicon layer (14) is preferably patterned using photolithography (e.g. deposit photoresist, expose photoresist, develop photoresist, etch).

Figure 4:
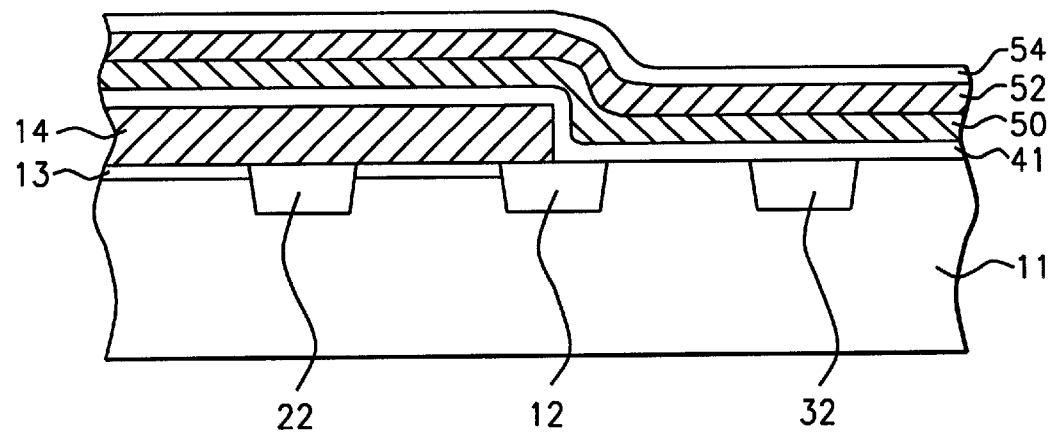

Referring to FIG. 4, a second dielectric layer (41) is formed over the semiconductor structure (11) and the first polysilicon layer (14). The second dielectric layer is preferably composed of thermal oxide. The second dielectric layer is preferably formed using a furnace process, and preferably has a thickness of between about 30 Angstroms and 100 Angstroms.

Still referring to FIG. 4, a second polysilicon layer (50) is formed on the second dielectric layer (41). The second polysilicon layer (50) is preferably formed to a thickness of between about 500 Angstroms and 1500 Angstroms using a plasma enhanced chemical vapor deposition process. The second polysilicon layer (50) is preferably doped using phosphorous ions at a concentration of between about 1 E19 atm/cm$^3$ and 1 E22 atm/cm$^3$.

A silicide layer (52) is preferable formed on the second polysilicon layer (50). The silicide layer (52) can be formed by chemical vapor deposition of a layer of refractory metal silicide, such as tungsten silicide, on the second polysilicon layer (50). The silicide layer (52) preferably has a thickness of between about 1000 Angstroms and 2000 Angstroms.

A hard mask layer (54) is preferably formed on the silicide layer (52). The hard mask layer (54) is preferably composed of silicon nitride, and preferably has a thickness of between about 1000 Angstroms and 3000 Angstroms. The hard mask layer is preferably formed using a CVD furnace process.

Figure 5:
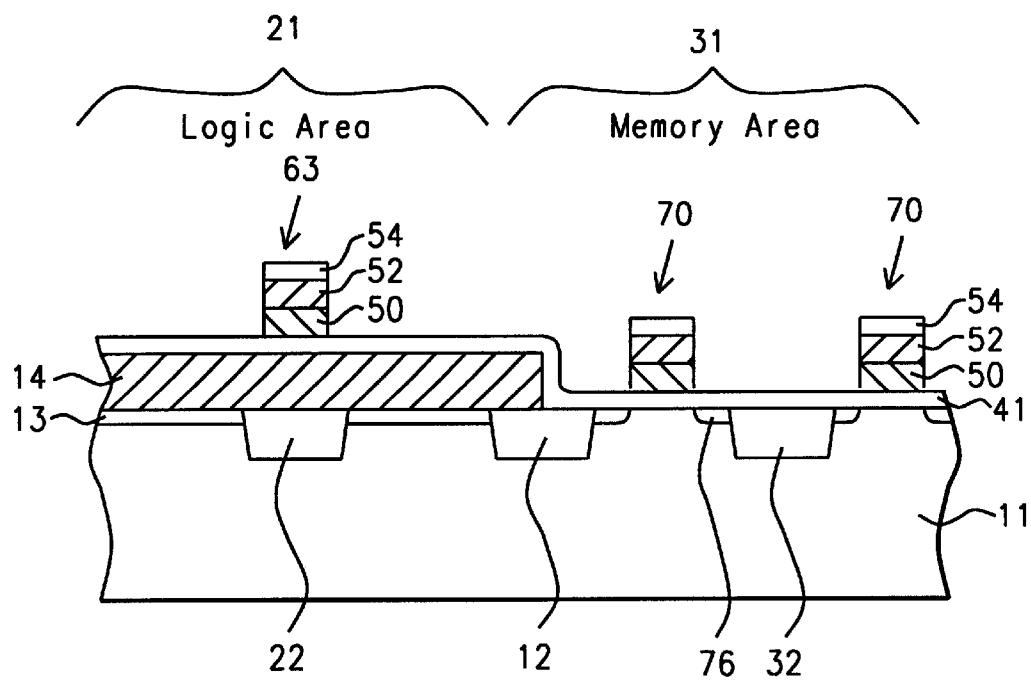

Referring to FIG. 5, the second polysilicon layer (50); the silicide layer (52); and the hard mask layer (54) are patterned to define a mixed mode capacitor top electrode (63) over the second isolation structure (22) in the logic area (21) and gates structures (70) in the memory area (31). The second polysilicon layer (50); the silicide layer (52); and the hard mask layer (54) can be patterned using photolithography as is known in the art. Source and drain regions (76) can be formed adjacent to the gate structures (70) in the memory area (31) by ion implantation. The hard mask layer (54) prevents ion implantation in the gate structures (70) in the memory area (31) and the capacitor top electrode (63) in the logic area.

Figure 6:
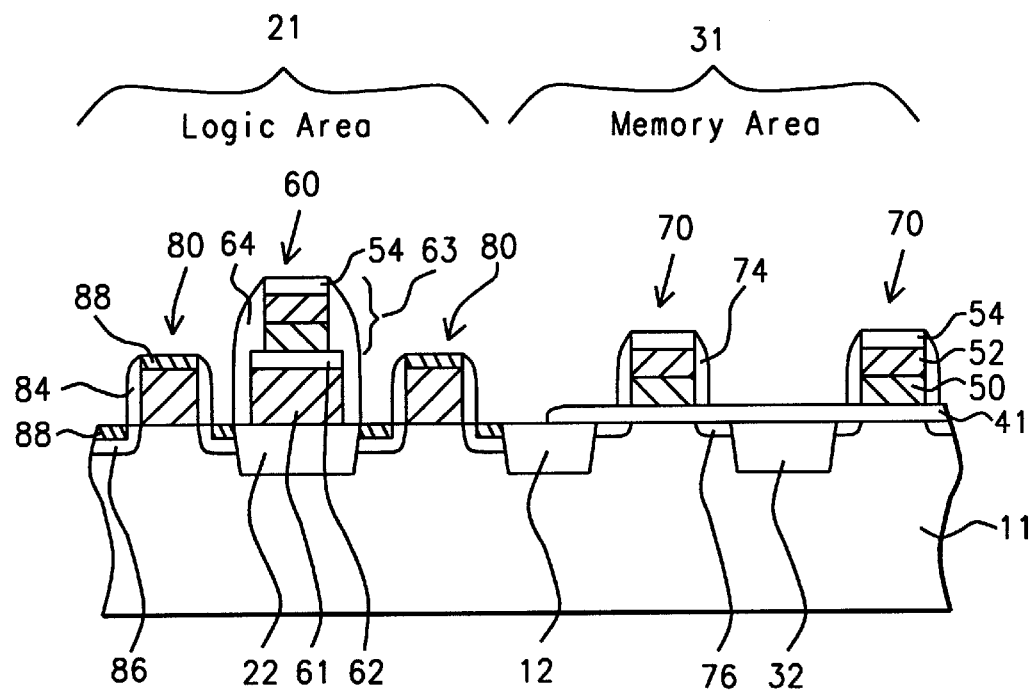

Referring to FIG. 6, the first polysilicon layer is patterned to define gate structures (80) and a capacitor dielectric (62) and bottom electrode (61) in the logic area. The resulting capacitor comprising: the bottom electrode (61), the capacitor dielectric (62), and the top electrode (63) is a mixed mode capacitor which can be used for either digital or analog applications. The mixed mode capacitor of the present invention can be formed in the inventor's existing embedded DRAM process with only one additional photo mask.

Still referring to FIG. 6, the logic gates can be completed by forming source and drain regions (86), spacers (84) and contacts (88). The source and drain regions (86) are formed by ion implantation, preferably using arsenic or phosphorous ions for NMOS devices or boron ions for PMOS devices. Arsenic ions can be implanted at a dose of between about 1 E14 atm/cm$^2$ and 1 E16 atm/cm$^2$ and an energy of between about 20 KeV and 50 KeV. The logic gates (80) can also be doped by the source and drain implant. The spacers (84) are formed by depositing a dielectric layer, such as silicon dioxide or silicon nitride, and anisotropically etching. During the dielectric layer deposition and anisotropic etch, sidewall spacers (64) are formed on the capacitor, and sidewall spacers (74) are formed on the memory gate structures (70). Contacts (88) are preferably formed by depositing a titanium layer and annealing to form titanium silicide at the contact areas where the titanium contacts silicon (e.g. the logic gate source and drain regions (86) and the logic gate structures (80), and the unreacted titanium is removed. The hard mask layer (54) prevents titanium silicide formation on the capacitor and the memory gates.

While the invention has been particularly shown and described with reference to the preferred embodiments thereof, it will be understood by those skilled in the art that various changes in form and detail may be made without departing from the spirit and scope of the invention.

What is claimed is:

1. A method for forming an embedded DRAM device with a mixed mode capacitor in the logic, comprising the steps of:
   a. providing a semiconductor structure having a logic area and a memory area; said logic area and said memory area being separated by an isolation structure; said logic area having thereon a second isolation structure;
   b. forming a first dielectric layer over said semiconductor structure, and forming a first polysilicon layer on said first dielectric layer;
   c. patterning said first polysilicon layer and said first dielectric layer to form an opening over said memory area;
   d. forming an implant mask over said first polysilicon layer; said implant mask having an opening over said second isolation structure;
   e. implanting impurity ions into said first polysilicon layer through said opening in said implant mask;
   f. removing said implant mask;
   g. forming a second dielectric layer over said semiconductor structure and said first polysilicon layer;
   h. forming a second polysilicon layer on said second dielectric layer; forming a silicide layer on said second polysilicon layer; and forming a hard mask layer on said silicide layer;
   i. patterning said second polysilicon layer; said silicide layer; and said hard mask layer to define a top electrode for a mixed mode capacitor over said second isolation structure in said logic area and gates in said memory area; and
   j. patterning said second dielectric layer to form a capacitor dielectric and patterning said first polysilicon layer to define gate structures and bottom electrode for a mixed-mode capacitor in said logic area.

2. The method of claim 1 wherein said first dielectric layer is composed of thermally grown silicon dioxide having a thickness of between about 30 Angstroms and 60 Angstroms.

3. The method of claim 1 wherein said second dielectric layer is composed of silicon oxide having a thickness of between about 30 Angstroms and 100 Angstroms.

4. The method of claim 1 wherein said second polysilicon layer has a thickness of between about 500 Angstroms and 1500 Angstroms; said silicide layer formed on said second polysilicon layer is composed of tungsten silicide having a thickness of between about 1000 Angstroms and 2000 Angstroms; and said hard mask layer is composed of silicon nitride having a thickness of between about 1000 Angstroms and 3000 Angstroms.

5. The method of claim 1 wherein phosphorous ions are implanted into said first polysilicon layer through said opening in said implant mask at a dose of between about 1 E14 atm/cm$^2$ and 1 E16 atm/cm$^2$ and at an energy of between about 20 KeV and 100 KeV.

6. The method of claim 1 which further includes forming source and drain regions adjacent to said gate structures in said logic area; forming sidewall spacers on said gate structures in said logic area, said capacitor in said logic area, and said gate structures in said memory area; and forming titanium silicide source and drain contacts in said logic area.

7. A method for forming an embedded DRAM device with a mixed mode capacitor in the logic, comprising the steps of:
   a. providing a semiconductor structure having a logic area and a memory area; said logic area and said memory area being separated by an isolation structure; said logic area having thereon a second isolation structure;
   b. forming a first dielectric layer over said semiconductor structure, and forming a first polysilicon layer on said first dielectric layer;
   c. patterning said first polysilicon layer and said gate dielectric layer to form an opening over said memory area;
   d. forming an implant mask over said first polysilicon layer; said implant mask having an opening over said second isolation structure;
   e. implanting impurity ions into said first polysilicon layer through said opening in said implant mask;
   f. removing said implant mask;
   g. forming a second dielectric layer over said semiconductor structure and said first polysilicon layer;
   h. forming a second polysilicon layer on said second dielectric layer; forming a silicide layer on said second polysilicon layer; and forming a hard mask layer on said silicide layer;
   i. patterning said second polysilicon layer; said silicide layer; and said hard mask layer to form top electrode for a mixed mode capacitor over said second isolation structure in said logic area and gates in said memory area;
   j. patterning said second dielectric layer to form a capacitor dielectric and patterning said first polysilicon layer to define gate structures and bottom electrode for a mixed-mode capacitor in said logic area;
   k. implanting impurity ions into said substrate structure to form source and drain regions adjacent to said gate structures in said logic area;
   l. forming sidewall spacers on said gate structures in said logic area and said gate structures in said memory area; and
   m. depositing a titanium layer over said substrate structure and annealing to form titanium silicide source and drain contacts in said logic area.

8. The method of claim 7 wherein said first dielectric layer is composed of thermally grown silicon dioxide having a thickness of between about 30 Angstroms and 60 Angstroms.

9. The method of claim 7 wherein said second dielectric layer is composed of silicon oxide having a thickness of between about 30 Angstroms and 100 Angstroms.

10. The method of claim 7 wherein said second polysilicon layer has a thickness of between about 500 Angstroms and 1500 Angstroms; said silicide layer formed on said second polysilicon layer is composed of tungsten silicide having a thickness of between about 1000 Angstroms and 2000 Angstroms; and said hard mask layer is composed of silicon nitride having a thickness of between about 1000 Angstroms and 3000 Angstroms.

11. The method of claim 9 wherein said second polysilicon layer has a thickness of between about 500 Angstroms and 1500 Angstroms; said silicide layer formed on said second polysilicon layer is composed of tungsten silicide having a thickness of between about 1000 Angstroms and 2000 Angstroms; and said hard mask layer is composed of silicon nitride having a thickness of between about 1000 Angstroms and 3000 Angstroms.

12. The method of claim 7 wherein phosphorous ions are implanted into said first polysilicon layer through said opening in said implant mask at a dose of between about 1 E14 atm/cm$^2$ and 1 E16 atm/cm$^2$ and at an energy of between about 20 KeV and 100 KeV.

13. The method of claim 11 wherein phosphorous ions are implanted into said first polysilicon layer through said opening in said implant mask at a dose of between about 1 E14 atm/cm$^2$ and 1 E16 atm/cm$^2$ and at an energy of between about 20 KeV and 100 KeV.

* * * * *